United States Patent [19]

Komatsu et al.

[11] Patent Number: 4,658,280
[45] Date of Patent: Apr. 14, 1987

[54] AMORPHOUS SILICON PHOTOSENSOR OF LAYERS HAVING DIFFERING CONDUCTIVITY

[75] Inventors: Toshiyuki Komatsu, Yokohama; Katsumi Nakagawa, Kawasaki; Masaki Fukaya, Yokohama; Tatsumi Shoji, Hiratsuka, all of Japan

[73] Assignee: Canon Kabushiki Kaisha, Tokyo, Japan

[21] Appl. No.: 586,972

[22] Filed: Mar. 7, 1984

[30] Foreign Application Priority Data

Mar. 11, 1983 [JP] Japan .................. 58-41160

[51] Int. Cl.⁴ .......................................... H01L 27/14
[52] U.S. Cl. ........................................... 357/30; 357/2; 357/58; 357/59
[58] Field of Search ............... 357/30, 30 K, 2, 58, 357/4, 59 C; 136/249 TJ

[56] References Cited

U.S. PATENT DOCUMENTS

| | | |
|---|---|---|
| 4,254,429 | 3/1981 | Yamazaki .................... 357/2 X |
| 4,271,328 | 6/1981 | Hamakawa et al. ............ 357/2 X |
| 4,459,163 | 7/1984 | Mac Diarmid et al. ........ 357/30 X |
| 4,460,669 | 7/1984 | Ogawa et al. ................ 357/2 X |
| 4,471,155 | 9/1984 | Mohr et al. ................. 357/2 X |
| 4,490,454 | 12/1984 | Misumi et al. .............. 357/2 X |

FOREIGN PATENT DOCUMENTS 0163956  9/1983  Japan ................................ 357/2

*Primary Examiner*—William D. Larkins
*Assistant Examiner*—William A. Mintel
*Attorney, Agent, or Firm*—Fitzpatrick, Cella, Harper & Scinto

[57] ABSTRACT

A photosensor comprises a first layer, a second layer and a third layer laminated successively, each layer comprising amorphous silicon and the third layer having at least a pair of electrodes separated from each other at a given interval, characterized in that said second layer has p-type semiconductor characteristics, said first layer and said third layer have semiconductor characteristics of a conduction type different from that of said second layer, and at least said first layer has photoconductivity.

12 Claims, 3 Drawing Figures

AMORPHOUS SILICON PHOTOSENSOR OF LAYERS HAVING DIFFERING CONDUCTIVITY

BACKGROUND OF THE INVENTION

1. Field of the Invention

This invention relates to a photosensor used as an photoelectric transducer which serves as an optical input equipment for various image information processing such as a facsimile and an optical character reader.

2. Description of the Prior Art

It has been generally well-known that a photosensor may be used as an photoelectric transducer for processing image information such as in facsimile, digital copying machines, etc.

In recent years, high-sensitivity readers using a long line-sensor have been known. Remarkable progress has been made in development of these devices as well known to the public.

As an example of a photosensor constituting a long line-sensor, there is a planar photoconductive photosensor comprising a pair of electrodes of metal and the like placed opposite to each other so as to form a gap for a light-receiving portion on a photoconductive layer comprising as photoconductive material chalcogenide, Cds, CdSSe, amorphous silicon (which is hereinafter referred to as "a-Si") and the like.

In such a planar photoconductive photosensor, traveling length l of photo-carriers generated by light incident upon the gap region (light-receiving part) between the electrodes can be expressed by the following equation: $l = \mu \cdot \tau \cdot E$, wherein $\mu$ is mobility of the carriers, $\tau$ is the lifetime of the carriers, and E is electric field intensity in the photoconductive layer. Accordingly, an increase of the electric field intensity E results in the increase of photoelectric current Ip because the traveling length l of the photo-carriers also increases. It is not problem to make photo-gain G at least 1, wherein $G = l/L$. L is the interelectrode distance at the light-receiving portion.

However, the above discussion in a photoconductive photosensor is not valid unless the electrodes are under ohmic contact with the photoconductive layer. Accordingly, there is generally interposed a layer (hereinafter referred to as an ohmic contact layer) to effect an ohmic contact between the electrodes and the photoconductive layer.

Since the photoconductive photosensor can produce large photoelectric current (signal) as described above, it can stably detect light information even if used for sensors with a minute light-receiving portion such as line-sensors and area-sensors.

A-Si, which is recently attracting attention as a photoconductive material for constituting photoconductive layers, is excellent in photosensitivity, stability, safety, etc., and therefore can be used to fabricate a photoconductive photosensor with excellent characteristics.

However, a-Si is known to be changed in its characteristics under irradiation of light due to the so-called Staebler-Wronski effect [Appl. Phys. Vol 30, 292 (1980)]. In particular, it has been reported that the value of photoelectric current, which is one of important characteristics of photosensors, decreases while the photosensor is continuously irradiated with light. Such decrease of photoelectric current occurs much more dramatically in the photoconductive sensors, as compared to the photodiode type sensors. Consequently, it has been extremely difficult to put a photoconductive sensor using a-Si into practical use.

For example, in a conventional photoconductive photosensor shown in a schematic sectional view of FIG. 1, it has been found in the course of our research that the characteristics of the photosensor significantly deteriorate upon irradiation of light.

In FIG. 1, 11 is a substrate, 12 is a photoconductive layer, 13 is an ohmic contact layer, and 14 are electrodes. That is, this conventional photosensor has the ohmic contact layer interposed between the electrodes and photoconductive layer formed on the substrate.

However, a conventional photosensor with this constitution has a problem in that attempts to prevent the deterioration of the characteristics by light irradiation have been attended by a reduction of light-response characteristics and decrease of photoelectric current.

SUMMARY OF THE INVENTION

An object of the present invention is to provide a photoconductive photosensor whose characteristics hardly change upon irradiation of light.

Another object of the invention is to provide a photoconductive photosensor such that the decrease of photoelectric current and the lowering of other characteristics such as light-response characteristics are well inhibited in addition to the prevention of the deterioration by irradiation of light.

According to the present invention there is provided a photosensor comprising a first layer, a second layer and a third layer laminated successively, each layer comprising amorphous silicon and the third layer having at least a pair of electrodes separated from each other at a given interval characterized in that said second layer has p-type semiconductor characteristics, said first layer and said third layer have a conduction type semiconductor characteristics different from that of said second layer, and at least said first layer has photoconductivity.

DETAILED DESCRIPTION OF THE PREFERRED EMBODIMENTS

The constitution of the present invention is described below in more detail.

Figure 1:
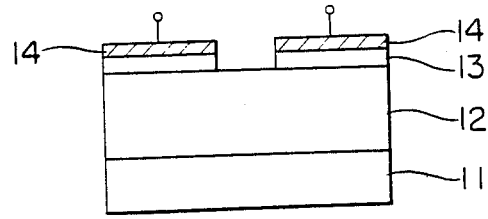
FIG. 1 is a schematic sectional view for illustration of a conventional prior art photosensor.
Figure 2:
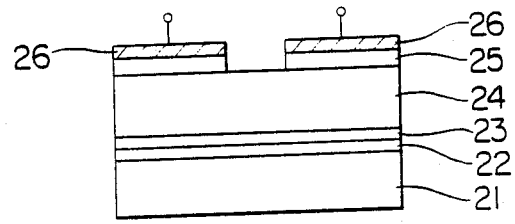
FIG. 2 is a schematic sectional view for illustration of a photosensor of the present invention.

FIG. 2 is a schematic sectional view for illustration of a preferred embodiment of the present invention. In the figure, 21 is a substrate, 22 is the first layer, 23 is the second layer, 24 is the third layer, 25 is an ohmic contact layer, and 26 are electrodes.

As shown in FIG. 2, according to the present invention, the first layer is formed on the substrate 21, and the second layer and the third layer are further formed on the first layer successively. The electrodes 26 are formed on the third layer through the ohmic contact layer interposed therebetween.

It is desirable to design the thickness of the layers and the amount of impurities doped so that the third layer may be lower than the first layer in bulk resistance when irradiated with light.

In the photosensor of the present invention, at least the first layer on the side for light incidence serves as a photoconductive layer. If there is ample quantity of incident light, the second and the third layers will of course also serve as photoconductive layers. It is preferred to design the photosensor so that sufficient light may strike the interface between the first layer and the second layer.

If the photoconductive layer is composed of a-Si, which has an absorption coefficient $\alpha$ (cm$^{-1}$) of about $3 \times 10^5$ at wavelength 400 nm, about $2 \times 10^5$ at 450 nm, about $1 \times 10^5$ at 500 nm and about $3 \times 10^4$ at 600 nm, the thickness of the layer capable of absorbing $(1-1/e) \times 100\%$ (about 63%, e: the base of the natural logarithms) of incident light is about 300 to 3000 Å for wavelengths of 400 to 600 nm. Therefore, the second layer is preferably formed at the distance of 3000 Å from the surface of the photoconductive layer on the side for light incidence.

The content of impurities in the first layer is preferably 0 to 500 atomic ppm based an Si, more preferably 5 to 250 atomic ppm. The thickness of the first layer is preferably 100 to 2000 Å, more preferably 250 to 1000 Å.

The content of impurities in the second layer is preferably 5 to 1000 atomic ppm based on Si, more preferably 10 to 500 atomic ppm. The thickness of the second layer is preferably 100 to 2000 Å, more preferably 250 to 1000 Å.

The content of impurities in the third layer is preferably 0 to 20 atomic ppm, more preferably 0 to 10 atomic ppm inclusive, and most preferably 0 to 5 atomic ppm. The thickness of the third layer is preferably 0.2 to 10 μm, more preferably 0.3 to 2 μm.

Impurities to be incorporated in the first and the third layers for controlling the a-Si layers to be n-type, are atoms of an element of the group $V_a$ in the periodic table, typically phosphorus atoms. On the other hand, for controlling the second layer to be p-type, atoms of an element of group $III_a$ of the periodic table, typically boron atoms are doped therein.

The first layer is preferably made n-type to increase the photoelectric current produced therein when irradiated.

Figure 3:
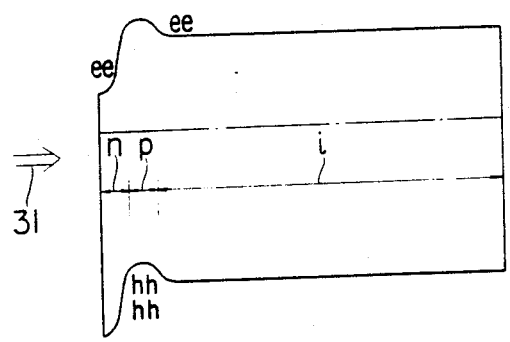
FIG. 3 is a schematic diagram showing a band-profile in the direction of thickness of the layers of a preferred photosensor according to the present invention.

FIG. 3 is a schematic diagram showing the band-profile in the direction of thickness of the layers of a preferred photosensor according to the invention. In this figure, 31 is incident light, e is an electron, and h is a hole.

As shown in FIG. 3, a well of potential is formed for holes in the photosensor of the invention. Therefore, electrons can be separated spatially from the holes to result in elongation of the lifetime of the electrons, whereby the objects of the present invention seem to be accomplished.

The present invention is described below with reference to preferred embodiments.

EXAMPLE 1

The procedures of fabricating the photosensor of the invention are briefly illustrated with Example 1.

First, a glass substrate was held at 250° C. in an RF (Radio Frequency) glow discharge apparatus (capacitive coupling type). A gas mixture containing 50 ppm of PH$_3$ gas diluted with SiH$_4$ gas was decomposed by RF glow discharge to form an n-type a-Si layer of 500 Å in thickness as the first layer on the substrate. Subsequently, a p-type a-Si layer of 500 Å in thickness was formed as the second layer by use of a gas mixture containing 50 ppm of B$_2$H$_6$ gas diluted with SiH$_4$ gas under the same conditions as mentioned above. Further, the third layer of 0.6 μm in thickness doped with no impurity was formed by use of SiH$_4$ gas only. After n$^+$-type ohmic contact layer of 0.1 μm in thickness doped with phosphorus atoms was formed, aluminum was deposited on the ohmic contact layer by vacuum deposition to form a pair of electrodes with a gap of 200 μm therebetween. Then, a part of the ohmic contact layer in the gap region between the electrodes was removed to provide the photosensor of this example. The impurity contents in the first and the second layers were both 50 ppm on the basis of silicon.

The photosensor of this example thus fabricated was subjected to the following measurements for evaluation.

First, while the photosensor was irradiated with GaP LED light (wavelength 555 nm) from the substrate side so that light intensity at the sensing surface thereof might be 10 μW/cm$^2$, voltages of ±200 volt were applied with triangular waves of 0.1 Hz between the electrodes to obtain a V-I curve. The same measurement was also conducted in the absence of irradiation of light. Mean conductivity $[(\Omega.cm)^{-1}]$ under irradiation of light ($\sigma_{10}$) and mean conductivity under no irradiation of light ($\sigma_0$) were calculated from the measured values of photoelectric current under 200 volts and the thickness of the photoconductive layer. Light-response characteristics of the photosensor were examined by irradiating with rectangular wave light produced by switching GaP LED on and off at a cycle of 100 Hz.

Also, the stability of the photosensor against irradiation of light was examined. The light receiving portion was continuously irradiated with 555 nm light at a light intensity of 1 mW/cm$^2$, and the change of photoelectric current caused thereby was observed. In this way, the time (T) for photoelectric current to attain a value 1/e (about 37%) of its initial value was determined.

The results of measurements are given in Table 1.

As seen from Table 1, the stability of the photosensor of this example against irradiation of light was an extremely good value, 380 hours. The photoelectric current obtained was also an extremely good value.

EXAMPLES 2-5

The same measurement as in Example 1 was repeated for the photosensors prepared under the conditions such that thickness and the impurity content of the first and the third layers were the same as in Example 1 but those of the second layer were changed as given in Table 2.

As seen from Table 2, a sufficient photoelectric current was obtained and the stability against irradiation of light was excellent in all of Examples 2-5.

EXAMPLES 6-10

The same measurement as in Example 1 was repeated for the photosensors prepared under the conditions such that thickness and the impurity content of the first and the third layers were the same as in Example 1 but those of the second layer were changed as given in Table 3. The results are given in Table 3.

As seen from Table 3, a sufficient photoelectric current was obtained and the stability against irradiation of light was excellent in all of Examples 6-10.

EXAMPLES 11-15

The same measurement as in Example 1 was repeated for the photosensors prepared under the conditions such that thickness and the impurity content of the first and the third layers were the same as in Example 1 but those of the second layer were changed as given in Table 4. The results are given in Table 4.

As seen from Table 4, a sufficient photoelectric current was obtained and stability against irradiation of light was excellent in all of Examples 11-15.

COMPARATIVE EXAMPLES 1-7

The following photosensors were fabricated as Comparative Examples.

Photosensors having a single photoconductive layer: Comparative Examples 1 to 3.

Photosensors having two photoconductive layers: Comparative Examples 4 to 6.

Photosensors having three photoconductive layers, with the second layer having n-type semiconductor characteristics, not p-type semiconductor according to the present invention: Comparative Example 7.

These sensors are constituted specifically as described below.

Comparative Example 1: a photosensor having a photoconductive layer comprising an a-Si layer of 0.7 $\mu$m in thickness containing no impurity.

Comparative Example 2: a photosensor having a photoconductive layer comprising an a-Si layer of 0.7 $\mu$m in thickness containing 2.5 atomic ppm of phosphorus based on the weight of silicon.

Comparative Example 3: a photosensor having a photoconductive layer comprising an a-Si layer of 0.7 $\mu$m in thickness containing 10 atomic ppm of boron based on the weight of silicon.

Comparative Example 4: a photosensor having a first layer comprising an a-Si layer of 1000 Å in thickness containing 50 atomic ppm of phosphorus base on the weight of silicon and a second layer comprising an a-Si layer of 6000 Å in thickness containing no impurity.

Comparative Example 5: a photosensor having a first layer comprising an a-Si layer of 1000 Å in thickness containing 50 atomic ppm of phosphorus base on the weight of silicon and a second layer comprising an a-Si layer of 6000 Å in thickness containing no impurity.

Comparative Example 6: a photosensor having a first layer comprising an a-Si layer of 1000 Å in thickness containing 50 atomic ppm of boron base on the weight of silicon and a second layer comprising an a-Si layer of 6000 Å in thickness containing no impurity.

Comparative Example 7: a photosensor having a first layer comprising an a-Si layer of 500 Å in thickness containing 50 atomic ppm of boron based on the weight of silicon, a second layer comprising an a-Si layer of 500 Å in thickness containing 50 atomic ppm of phosphorus based on the weight of silicon and a third layer comprising an a-Si layer of 6000 Å in thickness containing no impurity.

In all Comparative Examples, the ohmic contact layer and the electrodes are formed in the same manner as in Examples 1 to 15.

The photosensors of the Comparative Examples were subjected to the measurements. The results are given in Table 5.

As seen from Table 5, the photosensors of all Comparative Examples except Comparative Example 3 are inferior to those of the present Examples in stability against deterioration by irradiation of light.

The photosensor of comparative Example 3 is fair in stability but the conductivity expressed by $\sigma_{10}$ and $\sigma_0$ is low. Therefore, is is impossible to overcome the problem that uses of the photosensor are limited because of the difficulty in producing a large photoelectric current.

As described above, the present invention provides the photosensor capable of producing large photoelectric current. The invention provides a photosensor which is excellent in stability against deterioration by irradiation of light. Further, the invention provides the photosensor using a-Si as a material for the device which does not deteriorate by irradiation of light.

For the purpose of reference, all the layers of the photosensor of Example 1 were changed to 0.6 $\mu$m thick to give the optical and electrical characteristics as shown in Table 6.

TABLE 1

| | $\sigma_{10}$ | $\sigma_0$ | T(h) |
|---|---|---|---|
| Example 1 | $1.3 \times 10^{-5}$ | $2 \times 10^{-9}$ | 380 |

TABLE 2

| Example No. | 2nd layer: amount of doped boron based on silicon (atomic ppm) | Thickness of 2nd layer (Å) | $\sigma_{10}$ | $\sigma_0$ | T(h) |
|---|---|---|---|---|---|
| 2 | 5 | 2000 | $1.0 \times 10^{-5}$ | $2 \times 10^{-9}$ | 110 |
| 3 | 10 | 1000 | $9 \times 10^{-6}$ | $1.3 \times 10^{-9}$ | 130 |
| 4 | 500 | 250 | $1.1 \times 10^{-5}$ | $1.5 \times 10^{-9}$ | 500 |
| 5 | 1000 | 100 | $1.3 \times 10^{-5}$ | $4 \times 10^{-9}$ | 210 |
| 1 | 50 | 500 | $1.3 \times 10^{-5}$ | $2 \times 10^{-9}$ | 380 |

TABLE 3

| Example No. | 1st layer: a-mount of doped phosphorus based on silicon (atomic ppm) | Thickness of 1st layer (Å) | $\sigma_{10}$ | $\sigma_0$ | T(h) |
|---|---|---|---|---|---|
| 6 | 0 | 500 | $1.9 \times 10^{-6}$ | $4 \times 10^{-10}$ | 180 |
| 7 | 5 | 1000 | $4 \times 10^{-6}$ | $7 \times 10^{-10}$ | 190 |
| 8 | 5 | 2000 | $5 \times 10^{-6}$ | $1 \times 10^{-9}$ | 170 |
| 9 | 250 | 250 | $1.4 \times 10^{-5}$ | $2 \times 10^{-9}$ | 730 |
| 10 | 500 | 100 | $8 \times 10^{-6}$ | $1.5 \times 10^{-9}$ | 670 |
| 1 | 50 | 500 | $1.3 \times 10^{-5}$ | $2 \times 10^{-9}$ | 380 |

TABLE 4

| Example No. | 3rd layer: a-mount of doped phosphorus based on silicon (atomic ppm) | Thickness of 3rd layer ($\mu$m) | $\sigma_{10}$ | $\sigma_0$ | T(h) |
|---|---|---|---|---|---|
| 11 | 0 | 0.2 | $2 \times 10^{-6}$ | $6 \times 10^{-10}$ | 410 |
| 12 | 0 | 0.3 | $4 \times 10^{-6}$ | $7 \times 10^{-10}$ | 520 |
| 13 | 0 | 2 | $3 \times 10^{-5}$ | $5 \times 10^{-9}$ | 350 |
| 14 | 0 | 10 | $5 \times 10^{-5}$ | $1 \times 10^{-8}$ | 440 |
| 15 | 5 | 0.6 | $3 \times 10^{-5}$ | $8 \times 10^{-9}$ | 710 |
| 1 | 0 | 0.6 | $1.3 \times 10^{-5}$ | $2 \times 10^{-9}$ | 380 |

TABLE 5

| Comparative Example No. | $\sigma_{10}$ | $\sigma_0$ | T(h) |
|---|---|---|---|
| 1 | $2 \times 10^{-6}$ | $7 \times 10^{-10}$ | 15 |
| 2 | $1.9 \times 10^{-5}$ | $4 \times 10^{-8}$ | 12 |
| 3 | $1.3 \times 10^{-7}$ | $1 \times 10^{-10}$ | 90 |
| 4 | $1.8 \times 10^{-6}$ | $8 \times 10^{-10}$ | 14 |

TABLE 5-continued

| Comparative Example No. | $\sigma_{10}$ | $\sigma_0$ | T(h) |
| --- | --- | --- | --- |
| 5 | $2.6 \times 10^{-5}$ | $2 \times 10^{-8}$ | 15 |
| 6 | $6 \times 10^{-7}$ | $3 \times 10^{-10}$ | 30 |
| 7 | $1.6 \times 10^{-5}$ | $1 \times 10^{-8}$ | 33 |

TABLE 6

| | 1st layer | 2nd layer | 3rd layer |
| --- | --- | --- | --- |
| Optical band gap $E_{opt}$ | 1.7 (eV) | 1.7 | 1.7 |
| Activation Energy ($\sigma \alpha \sigma_0 \exp(-Ea/kT)$) | 0.3 (eV) | 0.8 | 0.65 |

In Table 6, the terms in the expression "$\exp(-Ea/kT)$" are defined as follows: "$\exp$" is an abbreviation for exponential and means natural logarithm; "Ea" is activation energy; "k" is Boltzmann constant and "T" is absolute temperature.

The proportional expression "$\exp(-Ea/kT)$" indicates that the activation energy is calculated according to the proportional expression.

What we claimed is:

1. A photoconductive photosensor comprising in sequence a laminate of a first layer, a second layer and a third layer, each layer comprising amorphous silicon and the third layer having at least a pair of electrodes separated from each other at a given interval said electrodes not being directly connected to each other, characterized in that said second layer has p-type semiconductor characteristics, said first layer and said third layer have N-type or undoped semiconductor characteristics, and at least said first layer has photoconductivity.

2. A photosensor according to claim 1, wherein the first layer contains an impurity.

3. A photosensor according to claim 2, wherein the content of the impurity in the first layer is not more than 500 atomic ppm based on the weight of silicon.

4. A photosensor according to claim 2, wherein the content of the impurity in the first layer is 5 to 250 atomic ppm based on the weight of silicon.

5. A photosensor according to claim 1, wherein the first layer is 100 to 2000 Å in thickness.

6. A photosensor according to claim 1 wherein the second layer contains an impurity in amounts from 5 to 1000 atomic ppm based on the weight of silicon.

7. A photosensor according to claim 1, wherein the second layer is 100 to 2000 Å in thickness.

8. A photosensor according to claim 1, wherein the third layer contains an impurity.

9. A photosensor according to claim 8, wherein the content of the impurity in the third layer is not more than 20 atomic ppm based on the weight of silicon.

10. A photosensor according to claim 1, wherein the third layer is 0.2 to 10 μm in thickness.

11. A photosensor according to claim 1, wherein atoms of an element of the group Va in the periodic table are doped in at least one of the first layer and the third layer.

12. A photosensor according to claim 1, wherein atoms of an element of the group IIIa in the periodic table are doped in the second layer.

* * * * *